US011869877B2

(12) United States Patent
Hou et al.

(10) Patent No.: US 11,869,877 B2
(45) Date of Patent: Jan. 9, 2024

(54) BONDED ASSEMBLY INCLUDING INTER-DIE VIA STRUCTURES AND METHODS FOR MAKING THE SAME

(71) Applicant: SANDISK TECHNOLOGIES LLC, Addison, TX (US)

(72) Inventors: Lin Hou, Leuven (BE); Peter Rabkin, Cupertino, CA (US); Yangyin Chen, Leuven (BE); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/396,291

(22) Filed: Aug. 6, 2021

(65) Prior Publication Data
US 2023/0042438 A1 Feb. 9, 2023

(51) Int. Cl.
*H01L 23/32* (2006.01)
*H01L 25/065* (2023.01)
(Continued)

(52) U.S. Cl.
CPC .... *H01L 25/0657* (2013.01); *H01L 21/76898* (2013.01); *H01L 23/32* (2013.01); *H01L 23/481* (2013.01); *H01L 24/19* (2013.01); *H01L 24/20* (2013.01); *H01L 24/73* (2013.01); *H01L 24/83* (2013.01); *H01L 25/50* (2013.01);
(Continued)

(58) Field of Classification Search
CPC ..... H01L 25/0657; H01L 24/19; H01L 24/20; H01L 24/83
See application file for complete search history.

(56) References Cited

U.S. PATENT DOCUMENTS 8,324,730 B2 12/2012 Koike et al.
8,563,403 B1 10/2013 Farooq et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Trang Q Tran
(74) *Attorney, Agent, or Firm* — THE MARBURY LAW GROUP PLLC

(57) ABSTRACT

A bonded assembly includes a first semiconductor die and a second semiconductor die that are bonded to each other by dielectric-to-dielectric bonding. First conductive via structures vertically extend through the second semiconductor die and a respective subset of the first dielectric material layers in the first semiconductor die, and contact a respective first metal interconnect structure in the first semiconductor die. Second conductive via structures vertically extend through a second substrate and a respective subset of the second dielectric material layers in the second semiconductor die, and contacting a respective second metal interconnect structure in the second semiconductor die. Redistribution metal interconnect structures located over a backside surface of the second substrate electrically connect the first conductive via structures and the second conductive via structures, and provide electrical interconnection between the first semiconductor die and the second semiconductor die.

19 Claims, 13 Drawing Sheets

(51) Int. Cl.
      H01L 23/48      (2006.01)
      H01L 23/00      (2006.01)
      H01L 21/768     (2006.01)
      H01L 25/00      (2006.01)
(52) U.S. Cl.
      CPC .......... H01L 2224/2101 (2013.01); H01L
           2224/32146 (2013.01); H01L 2224/73267
        (2013.01); H01L 2224/83896 (2013.01); H01L
             2225/06541 (2013.01); H01L 2924/37001
                                            (2013.01)

(56)              References Cited

U.S. PATENT DOCUMENTS

| | | | |
|---|---|---|---|
| 8,674,515 | B2 | 3/2014 | Farooq et al. |
| 8,860,229 | B1 * | 10/2014 | Lin .................. H01L 21/76898 257/774 |
| 9,530,790 | B1 | 12/2016 | Lu et al. |
| 9,620,479 | B1 | 4/2017 | Edelstein et al. |
| 9,716,088 | B1 | 7/2017 | Edelstein et al. |
| 10,115,681 | B1 | 10/2018 | Ariyoshi |
| 10,283,493 | B1 | 5/2019 | Nishida |
| 10,354,980 | B1 | 7/2019 | Mushiga et al. |
| 10,354,987 | B1 | 7/2019 | Mushiga et al. |
| 10,381,322 | B1 | 8/2019 | Azuma et al. |
| 10,381,362 | B1 | 8/2019 | Cui et al. |
| 10,510,738 | B2 | 12/2019 | Kim et al. |
| 10,629,616 | B1 | 4/2020 | Kai et al. |
| 10,665,580 | B1 | 5/2020 | Hosoda et al. |
| 10,665,581 | B1 | 5/2020 | Zhou et al. |
| 10,700,028 | B2 | 6/2020 | Nishida |
| 10,707,228 | B2 | 7/2020 | Yu et al. |
| 10,714,497 | B1 | 7/2020 | Nishida et al. |
| 10,723,444 | B2 | 7/2020 | Gionta et al. |
| 10,727,216 | B1 | 7/2020 | Kai et al. |
| 10,741,535 | B1 | 8/2020 | Nishikawa et al. |
| 10,790,296 | B1 | 9/2020 | Yamaha et al. |
| 10,797,035 | B1 | 10/2020 | Sano et al. |
| 10,797,062 | B1 | 10/2020 | Nishikawa et al. |
| 10,804,202 | B2 | 10/2020 | Nishida |
| 10,811,058 | B2 | 10/2020 | Zhang et al. |
| 10,854,573 | B2 | 12/2020 | Ji et al. |
| 10,879,260 | B2 | 12/2020 | Uryu et al. |
| 10,957,680 | B2 | 3/2021 | Yada et al. |
| 10,957,705 | B2 | 3/2021 | Totoki et al. |
| 10,985,169 | B2 | 4/2021 | Kai et al. |
| 11,069,703 | B2 | 7/2021 | Nishida et al. |
| 2005/0104187 | A1 | 5/2005 | Polsky et al. |
| 2006/0035450 | A1 | 2/2006 | Frank et al. |
| 2008/0191310 | A1 | 8/2008 | Wu et al. |
| 2008/0246126 | A1 | 10/2008 | Bowles et al. |
| 2012/0223440 | A1 | 9/2012 | Fujita |
| 2013/0267046 | A1 | 10/2013 | Or-Bach et al. |
| 2015/0021784 | A1 | 1/2015 | Lin |
| 2015/0145141 | A1 | 5/2015 | Uzoh et al. |
| 2016/0079164 | A1 | 3/2016 | Fukuzumi et al. |
| 2016/0181150 | A1 | 6/2016 | Liu et al. |
| 2017/0062392 | A1 | 3/2017 | Cheng et al. |
| 2017/0125376 | A1 | 5/2017 | Yeh et al. |
| 2017/0186665 | A1 | 6/2017 | Choudhury et al. |
| 2017/0323919 | A1 | 11/2017 | Kumar et al. |
| 2018/0151589 | A1 | 5/2018 | Shimizu et al. |
| 2018/0350785 | A1 | 12/2018 | Fong et al. |
| 2019/0043868 | A1 | 2/2019 | Hasnat et al. |
| 2020/0027868 | A1 * | 1/2020 | Lin .................. H01L 21/76895 |
| 2020/0066703 | A1 | 2/2020 | Kim et al. |
| 2020/0098618 | A1 | 3/2020 | Tsai et al. |
| 2020/0286815 | A1 | 9/2020 | Moriyama et al. |
| 2020/0286875 | A1 * | 9/2020 | Nishida .................. H01L 24/09 |
| 2020/0321315 | A1 | 10/2020 | Yu et al. |
| 2020/0357783 | A1 | 11/2020 | Kai et al. |
| 2020/0395350 | A1 | 12/2020 | Wu et al. |

OTHER PUBLICATIONS

S. Kim et al., "Permanent Wafer Bonding in the Low Temperature by Using Various Plasma Enhanced Chemical Vapor Deposition Dielectrics," 2015 International 3D Systems Integration Conference (3DIC), Sendai, 2015, pp. TS7.2.1-TS7.2.4. 4 pages.
L. Peng et al., "Advances in SiCN-SiCN Bonding with High Accuracy Wafer-to-Wafer (W2W) Stacking Technology," 2018 IEEE International Interconnect Technology Conference (IITC), Santa Clara, CA, 2018, pp. 179-181.
F. Inoue et al., "Influence of Composition of SiCN Film for Surface Activated Bonding," ECS Transactions, 86 (5) 159-168 (2018).
R. Gordon et al., "Chemical Vapor Deposition (CVD) of Manganese Self-Aligned Diffusion Barriers for Cu Interconnections in Microelectronics", Advanced Metallization Conference 2008, Harvard Library, 10 pages.
T. Plach et al., "Mechanisms for room temperature direct wafer bonding", Journal of Applied Physics 113, 094905 (2013) 8 pages.
Y. Otsuke et al., "Graded composition and valence states in self-forming barrier layers at Cu—Mn / SiO 2 interface", Applied Physics Letters 96, 012101 (2010) 4 pages.
J. Koike et al., "Self-forming diffusion barrier layer in Cu—Mn alloy metallization", Applied Physics Letters 87, 041911 (2005) 4 pages.
J.M. Ablett et al., "Phase identification of self-forming Cu—Mn based diffusion barriers on p-SiOC : H and SiO 2 dielectrics using x-ray absorption fine structure", Applied Physics Letters 94, 042112 (2009) 4 pages.
J. Koike et al., "Growth kinetics and thermal stability of a self-formed barrier layer at Cu—Mn/SiO 2 Interface", Journal of Applied Physics 102, 043527 (2007) 8 pages.
N. Phuong et al., "Effects of Adsorbed Moisture in SiO2 Substrates on the Formation of a Mn Oxide Layer by Chemical Vapor Deposition", Journal of Physical Chemistry, Department of Material Science, Tohoku University, (2011) 6 pages.
He, Weiye, et al. "Cu Barrier Seed Innovation for EM Improvement." ECS Transactions 60.1 (2014): 471.
Fumihiro Inoue et al.2021 Jpn. J. Appl. Phys. 60 026502.
J. De Messemaeker, et al., 2019 IITC-MAM, 8.4.
Banerjee, Gautam, and Robert L. Rhoades. "Chemical mechanical planarization historical review and future direction." ECS Transactions 13.4 (2008): 1.
Seo J. A review on chemical and mechanical phenomena at the wafer interface during chemical mechanical planarization. Journal of Materials Research, 2021: 1-23.
International Search Report and Written Opinion, International Patent Application No. PCT/US2019/068868, dated Apr. 7, 2020, 17 pages.
Gordon, R.G et al., "Chemical vapor deposition (CVD) of manganese self-aligned diffusion barriers for Cu interconnections in microelectronics," In Advanced Metallization Conference 2008 (AMC 2008): Proceedings of the conference: Sep. 23-25, 2008, San Diego, California, U.S.A. and Oct. 8-10, 2008, at the University of Tokyo, Tokyo, Japan. Materials Research Society conference proceedings. Warrendale, Pa: Materials Research Society. Retrieved from the Internet: URL: http://faculty.chemistry.harvard.edu/files/gordon/files/mn_self-align_barrier_advmetconf_321-9_2009.pdf, Sep. 25, 2008 (Sep. 25, 2008).
Dixit, V. K. et al., "Structural and Electronic Properties of a Mn Oxide Diffusion Barrier Layer Formed by Chemical Vapor Deposition," IEEE Transactions On Device and Materials Reliability, vol. 11, No. 2, pp. 295-302, Jun. 2011.
K.W. Guarini et al., "Electrical Integrity of State-of-the-Art 0.13 μm SOI CMOS Devices and Circuits Transferred for Three-Dimensional (3D) Integrated Circuit (IC) Fabrication", IEEE proceeding in IEDM 2002, 3 pages.
James J.-Q. Lu; "Enabling Technologies: Wafer-to-Wafer Bonding" 2014 IEDM Short Course, 3D System Integration Technology, Dec. 14, 2014, 149 pages.
International Search Report and Written Opinion, International Patent Application No. PCT/US2019/068639, dated Apr. 16, 2020, 15 pages.

(56) References Cited

OTHER PUBLICATIONS

Notification of Transmittal of The International Search Report and Written Opinion of the International Searching Authority for International Patent Application No. PCT/US2022/027542, dated Oct. 2, 2022, 10 pages.

* cited by examiner

BONDED ASSEMBLY INCLUDING INTER-DIE VIA STRUCTURES AND METHODS FOR MAKING THE SAME

FIELD

The present disclosure relates generally to the field of semiconductor devices, and particularly to a bonded assembly including inter-die via structures and methods for making the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a bonded assembly is provided, which comprises: a first semiconductor die comprising a first substrate, first semiconductor devices located on the first substrate, first dielectric material layers located on the first semiconductor devices, and first metal interconnect structures embedded in the first dielectric material layers; a second semiconductor die overlying the first semiconductor die, and comprising a second substrate, second semiconductor devices located on the second substrate, second dielectric material layers located on the second semiconductor devices, and second metal interconnect structures embedded in the second dielectric material layers; first conductive via structures vertically extending through the second substrate, the second dielectric material layers, and a respective subset of the first dielectric material layers, and contacting a respective one of the first metal interconnect structures; second conductive via structures vertically extending through the second substrate and a respective subset of the second dielectric material layers, and contacting a respective one of the second metal interconnect structures; and redistribution metal interconnect structures located over a backside surface of the second substrate and electrically connecting the first conductive via structures and the second conductive via structures.

According to another embodiment of the present disclosure, a method of forming a bonded assembly is provided, which comprises: providing a first semiconductor die comprising a first substrate, first semiconductor devices overlying the first substrate, first dielectric material layers overlying the first semiconductor devices, and first metal interconnect structures embedded in the first dielectric material layers; providing a second semiconductor die comprising a second substrate, second semiconductor devices overlying the second substrate, second dielectric material layers overlying the second semiconductor devices, and second metal interconnect structures embedded in the second dielectric material layers; bonding the second semiconductor die to the first semiconductor die employing dielectric-to-dielectric bonding such that the first dielectric material layers face the second dielectric material layers; forming via cavities in a bonded assembly of the first semiconductor die and the second semiconductor die, wherein the via cavities comprise first via cavities that extend through the second substrate, the second dielectric material layers, and a respective subset of the first dielectric material layers and to a respective one of the first metal interconnect structures, and second via cavities that extend through the second substrate and a respective subset of the second dielectric material layers and to a respective one of the second metal interconnect structures; forming first conductive via structures and second conductive via structures in the first via cavities and the second via cavities, respectively; and forming redistribution metal interconnect structures on the first conductive via structures and the second conductive via structures over a backside surface of the second substrate, the redistribution metal interconnect structures electrically connecting the first conductive via structures and the second conductive via structures.

DETAILED DESCRIPTION

Figure 1:
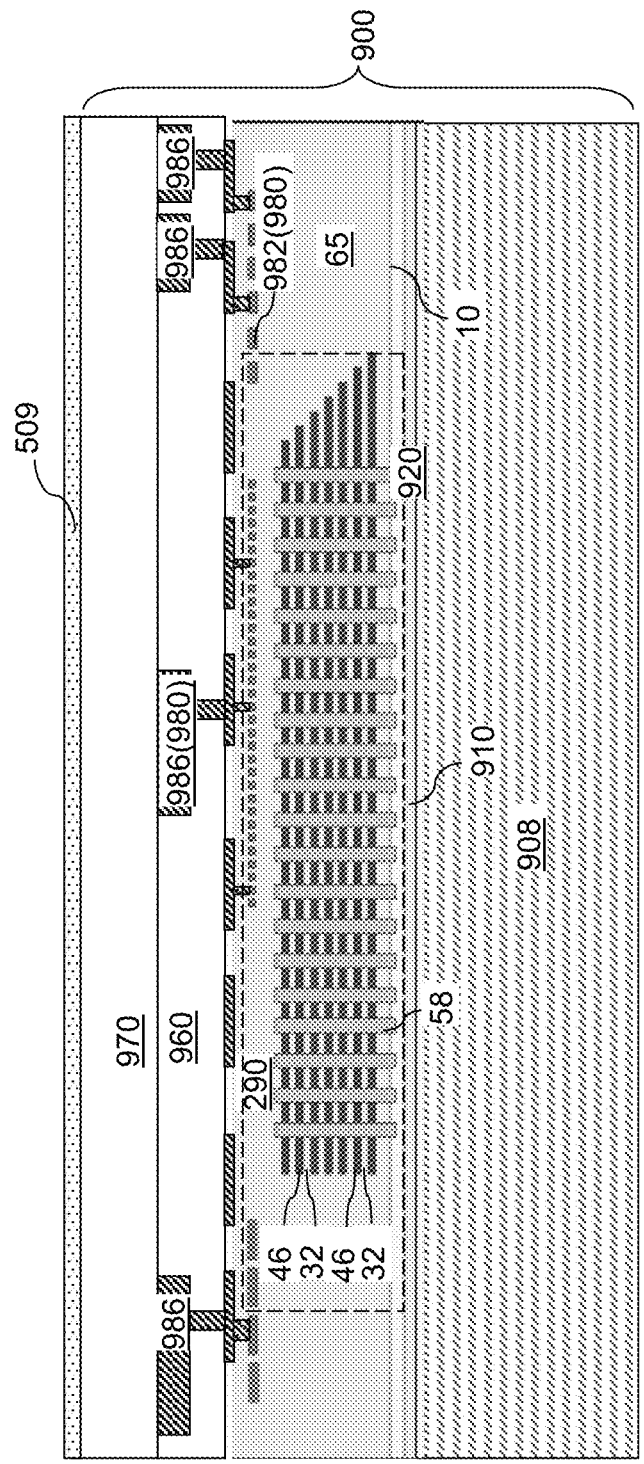
FIG. 1 is a schematic vertical cross-sectional view of a first semiconductor die prior to bonding according to a first embodiment of the present disclosure.

Embodiments of the present disclosure are directed to a bonded assembly including inter-die via structures and methods for making the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m.

As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The various three-dimensional memory devices of the present disclosure include a three-dimensional NAND string memory device, and may be fabricated using the various embodiments described herein. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first semiconductor die 900 according to a first embodiment of the present disclosure is illustrated. The first semiconductor die 900 includes a first substrate 908, first semiconductor devices 920 overlying the first substrate 908, first dielectric material layers (290, 960, 970) overlying the first semiconductor devices, and first metal interconnect structures 980 embedded in the first dielectric material layers (290, 960, 970). In one embodiment, the first substrate 908 may be a commercially available silicon wafer having a thickness in a range from 500 microns to 1 mm.

Generally, the first semiconductor devices 920 can comprise any semiconductor device known in the art. In one embodiment, the first semiconductor die 900 comprises a memory die, and may include a memory device, such as a three dimensional NAND memory device. In an illustrative example, the first semiconductor devices 920 can include memory devices comprising a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device. A memory opening fill structure 58 can be formed within each memory opening. A memory opening fill structure 58 can include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 can include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

The first dielectric material layers (290, 960, 970) can include first contact-level dielectric layers 290 embedding contact via structures 981 and bit lines 982, first interconnect-level dielectric layers 960 that embed a subset of the first metal interconnect structures 980 located above the first contact-level dielectric layers 290, and a first blanket dielectric material layer 970 that is formed above the first interconnect-level dielectric layers 960. The contact via structures contact various nodes of the first semiconductor devices. The bit lines 982 can contact a subset of the contact via structures (not shown for clarity) that are connected to the vertical semiconductor channels. Interconnect metal lines and interconnect metal via structures, which are a subset of the first metal interconnect structures 980 can be embedded in the first interconnect-level dielectric layers 960. The first metal interconnect structures 980 also include first metallic pad structures 986.

Each of the first contact-level dielectric layers 290 and the first interconnect-level dielectric layers 960 can include a dielectric material such as undoped silicate glass, a doped silicate glass, organosilicate glass, silicon nitride, a dielectric metal oxide, or a combination thereof. In one embodiment, the first blanket dielectric material layer 970 includes a silicon oxide material, such as undoped silicon dioxide or doped silicon oxide, such as a low-k dielectric comprising carbon and/or hydrogen doped silicon oxide ("SiOCH").

The thickness of the first blanket dielectric material layer 970 can be in a range from 10 nm to 300 nm, although lesser and greater thicknesses can also be employed. The first blanket dielectric material layer 970 can have a planar top surface, which can be provided, for example, by a planarization process such as a chemical mechanical polishing (CMP) process. In one embodiment, the first blanket dielectric material layer 970 may be free of any conductive structure therein at the processing step of FIG. 1. In this case, no conductive structure is present between the horizontal plane including a bottom surface of the first blanket dielectric material layer 970 and the horizontal plane including a top surface of the first blanket dielectric material layer 970 at the step of FIG. 1.

Optionally, a first bonding dielectric material layer 509 may be formed over the first blanket dielectric material layer 970. The first bonding dielectric material layer 509, if present, may include any dielectric material that may provide dielectric-to-dielectric bonding with the dielectric material on a topmost surface of a second semiconductor die to be subsequently provided. The first bonding dielectric material layer 509 may comprise a silicon oxide layer having a thickness in a range from 20 nm to 300 nm, such as from 50 nm to 100 nm. The total thickness of the first dielectric material layers (290, 960, 970) and the optional first bonding dielectric material layer 509 may be in a range from 1,000 nm to 10,000 nm, such as from 2,000 nm to 5,000 nm, although lesser and greater thicknesses may also be employed.

Figure 2:
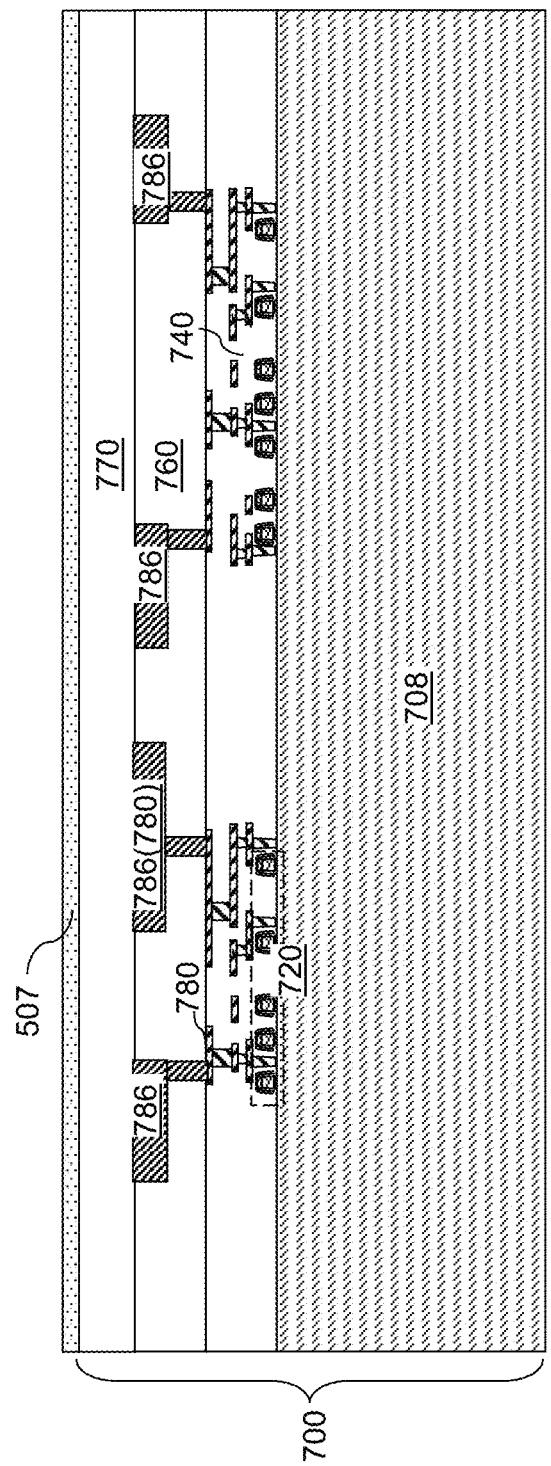
FIG. 2 is a schematic vertical cross-sectional view of a second semiconductor die prior to bonding according to the first embodiment of the present disclosure.

Referring to FIG. 2, a second semiconductor die 700 is illustrated. The second semiconductor die 700 includes a second substrate 708, second semiconductor devices 720 overlying the second substrate 708, second dielectric material layers (740, 760, 770) overlying the second semiconductor devices 720, and second metal interconnect structures 780 embedded in the second dielectric material layers (740, 760, 770). In one embodiment, the second semiconductor devices 720 may include peripheral (i.e., driver) circuitry comprising at least one complementary metal oxide semiconductor (CMOS) field effect transistors. In one embodiment, the second substrate 708 may be a commercially available silicon wafer having a thickness in a range from 500 microns to 1 mm.

Generally, the second semiconductor devices can comprise any semiconductor device that can be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support (e.g., peripheral) circuitry for operation of memory devices within the memory die. In one embodiment, the first semiconductor die 900 can include a three-dimensional NAND memory device including a three-dimensional array of memory elements (comprising portions of the memory opening fill structures 58 located at levels of the electrically conductive layers 46), word lines (comprising a subset of the electrically conductive layers 46), and bit lines 982, the second semiconductor devices 720 of the second semiconductor die 700 can include a peripheral circuitry for operation of the three-dimensional array of memory elements. The peripheral circuitry may include a word line driver that drives word lines of the three-dimensional array of memory elements within the first semiconductor die 900, a bit line driver that drives the bit lines 982 in the first semiconductor die 900, a word line decoder circuit that decodes the addresses for the electrically conductive layers 46, a bit line decoder circuit that decodes the addresses for the bit lines 982, a sense amplifier circuit that senses the states of memory elements within the memory opening fill structures 58 in the first semiconductor die 900, a source power supply circuit that provides power to the horizontal semiconductor channel layer 10 in the first semiconductor die 900, a data buffer and/or latch, or any other semiconductor circuit that may be used to operate three-dimensional array of memory elements in the first semiconductor die 900.

The second dielectric material layers (740, 760, 770) can include proximal interconnect-level dielectric layers 740 embedding a proximal subset 782 of the second metal interconnect structures 780 that is proximal to the second substrate 708, distal interconnect-level dielectric layers 760 embedding a distal subset 784 of second metal interconnect structures 780 that is distal from the second substrate 708, and a second blanket dielectric material layer 770 that is formed above the distal interconnect-level dielectric layers 760. The second metal interconnect structures 780 include second metallic pad structures 786 located within the distal interconnect-level dielectric layers 760. The proximal interconnect-level dielectric layers 740 and the distal interconnect-level dielectric layers 760 can include a dielectric material such as undoped silicate glass, a doped silicate glass, organosilicate glass, silicon nitride, a dielectric metal oxide, or a combination thereof.

The second blanket dielectric material layer 770 includes a silicon oxide material, such as undoped silicon dioxide or doped silicon oxide, such as a low-k dielectric comprising carbon and/or hydrogen doped silicon oxide ("SiOCH"). The thickness of the second blanket dielectric material layer 770 can be in a range from 10 nm to 300 nm, although lesser and greater thicknesses can also be employed.

The second blanket dielectric material layer 770 can have a planar top surface, which can be provided, for example, by a planarization process such as a chemical mechanical polishing (CMP) process. In one embodiment, the second blanket dielectric material layer 770 may be free of any conductive structure therein at the process step shown in FIG. 2. In this case, no conductive structure are present between the horizontal plane including a bottom surface of the second blanket dielectric material layer 770 and the horizontal plane including a top surface of the second blanket dielectric material layer 770 at the step of FIG. 2.

Optionally, a second bonding dielectric material layer 507 may be formed over the second blanket dielectric material layer 770. The second bonding dielectric material layer 507, if present, may include any dielectric material that may provide dielectric-to-dielectric bonding with the material of the first blanket dielectric material layer 70 or with the first bonding dielectric material layer 509. The thickness of the second bonding dielectric material layer 507, if present, may be a range from 20 nm to 300 nm, such as from 50 nm to 100 nm, although lesser and greater thicknesses may also be employed. The total thickness of the second dielectric material layers (740, 760, 770) and the optional second bonding dielectric material layer 507 may be in a range from 1,000 nm to 10,000 nm, such as from 2,000 nm to 5,000 nm, although lesser and greater thicknesses may also be employed.

Generally, one of the first semiconductor die 900 and the second semiconductor die 700 may comprise a memory die, and another of the first semiconductor die 900 and the second semiconductor die 700 comprises a logic die. In this case, the memory die may comprise a three-dimensional memory array that includes an alternating stack of insulating layers 32 and electrically conductive layers 46, memory openings vertically extending through the alternating stack (32, 46), memory opening fill structures 58 located in the memory openings and comprising a respective vertical stack of memory elements and a respective vertical semiconductor channel. The logic die may comprise a control circuit configured control operation of the three-dimensional memory array, the control circuit comprising word line drivers that apply word line control voltages to the electrically conductive layers and bit line drivers that apply bit line control voltages to bit lines which are electrically connected to end portions (e.g., to drain regions) of a respective subset of the vertical semiconductor channels.

Figure 3:
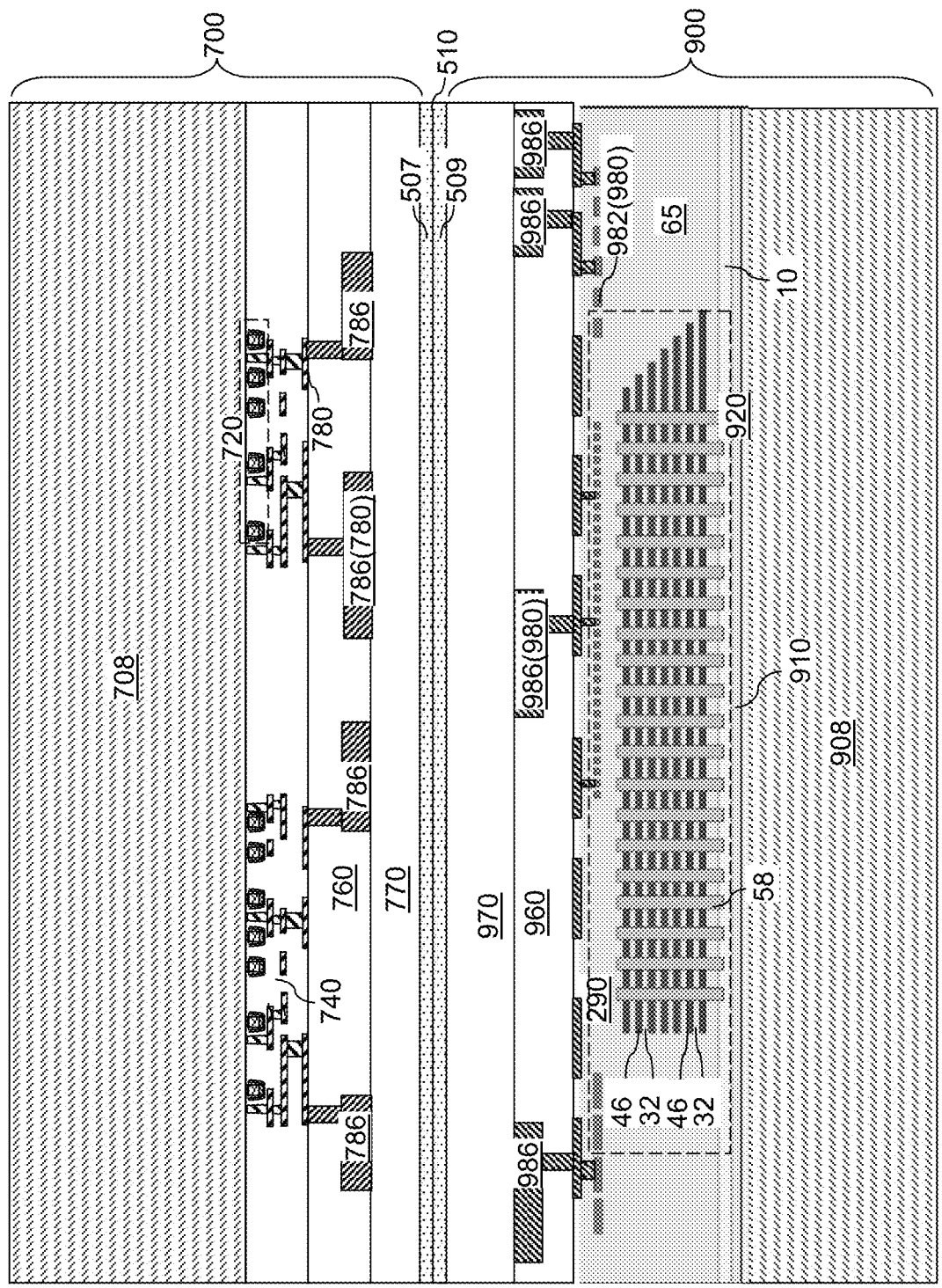
FIG. 3 is a schematic vertical cross-sectional view of an exemplary structure including the first semiconductor die and the second semiconductor die according to the first embodiment of the present disclosure.

Referring to FIG. 3, the first semiconductor die 900 and the second semiconductor die 700 are oriented such that a planar dielectric surface of the first semiconductor die 900 faces a planar dielectric surface of the second semiconductor die 700. Subsequently, the planar dielectric surface of the first semiconductor die 900 is brought into contact with the planar dielectric surface of the second semiconductor die 700. The planar dielectric surface of the first semiconductor die 900 may comprise a horizontal surface of the first blanket dielectric material layer 970 or a horizontal surface of the first bonding dielectric material layer 509. The planar dielectric surface of the second semiconductor die 700 may comprise a horizontal surface of the second blanket dielectric material layer 770 or a horizontal surface of the second bonding dielectric material layer 507.

A thermal anneal process can be performed at an elevated temperature to induce dielectric-to-dielectric bonding between the dielectric material of the first semiconductor die 900 and the dielectric material of the second semiconductor die 700 that contact each other. The elevated temperature of the thermal anneal process may be in a range from 150 degrees Celsius to 400 degrees Celsius, such as from 200 degrees Celsius to 350 degrees Celsius.

Generally, the second semiconductor die 700 can be bonded to the first semiconductor die 900 employing dielectric-to-dielectric bonding such that the first dielectric material layers 970 face the second dielectric material layers 770. The first semiconductor die 900 and the second semiconductor die 700 can be bonded to each other by dielectric-to-dielectric bonding at dielectric-to-dielectric bonding interface 510. In some embodiments, a horizontal surface of the first dielectric material layers 970 may be bonded to a horizontal surface of the second dielectric material layers 770 at the dielectric-to-dielectric bonding interface, or the first bonding dielectric material layer 509 is bonded to the second bonding dielectric material layer 507 at the dielectric-to-dielectric bonding interface 510.

Figure 4:
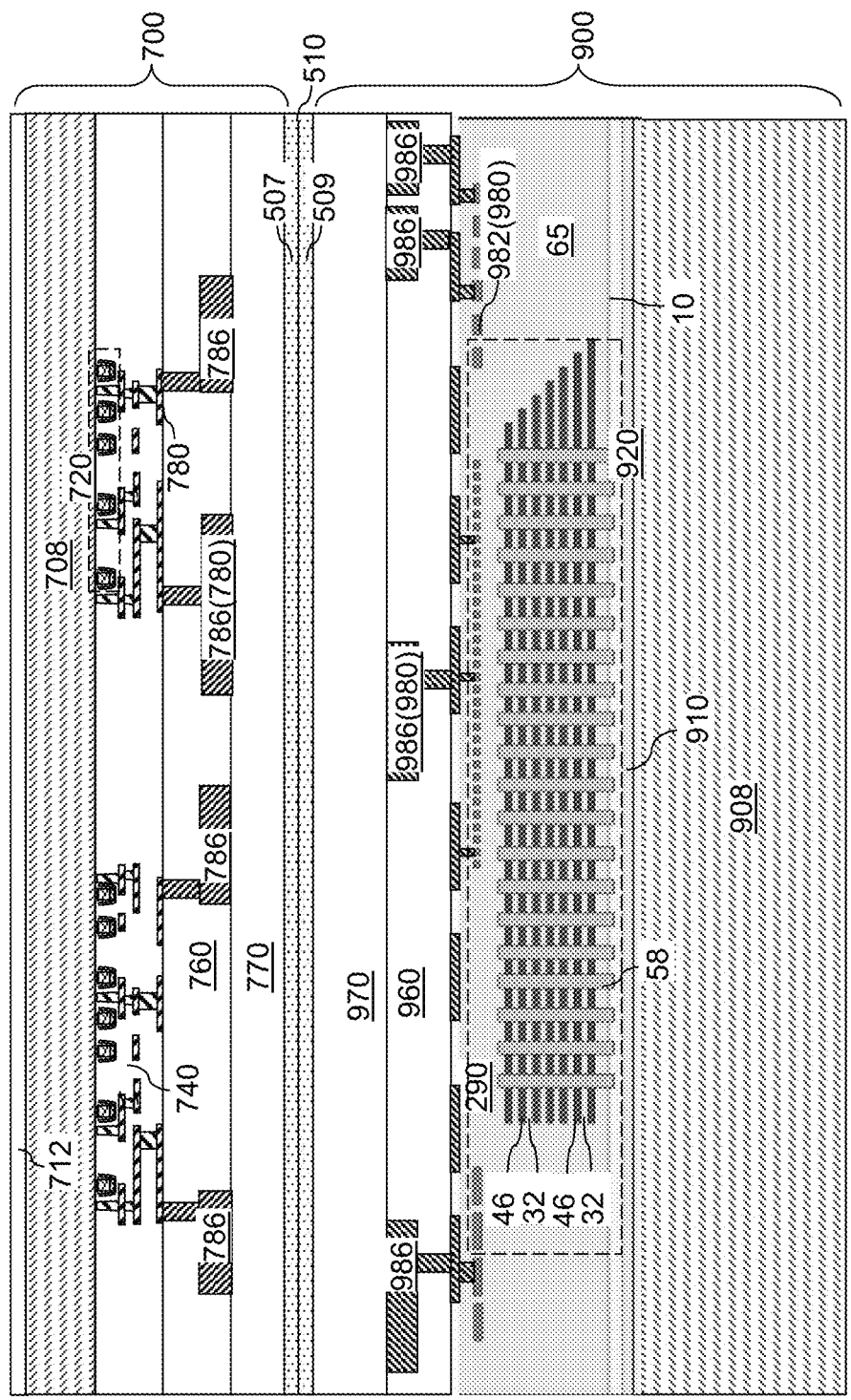
FIG. 4 is a schematic vertical cross-sectional view of the exemplary structure after thinning the second substrate and formation of a backside insulating layer according to the first embodiment of the present disclosure.

Referring to FIG. 4, one of the first substrate 908 and the second substrate 708 can be thinned. In the illustrated example, the second substrate 708 can be thinned, for example, by grinding, polishing, an isotropic etch process, or an anisotropic etch process such that the thickness of the second substrate 708 after thinning can be in a range from 300 nm to 3,000 nm, such as 500 nm to 1,500 nm, although lesser and greater thicknesses can also be employed.

An optional backside insulating layer 712 can be deposited on the thinned surface of the second substrate 708 by a conformal or non-conformal deposition method. The backside including layer 712 includes a dielectric material, such as silicon oxide. In one embodiment, the backside insulating layer 712 may be deposited by chemical vapor deposition (CVD). The thickness of the backside insulating layer 712 may be in a range from 30 nm to 300 nm, although lesser and greater thicknesses may also be employed.

Figure 5:
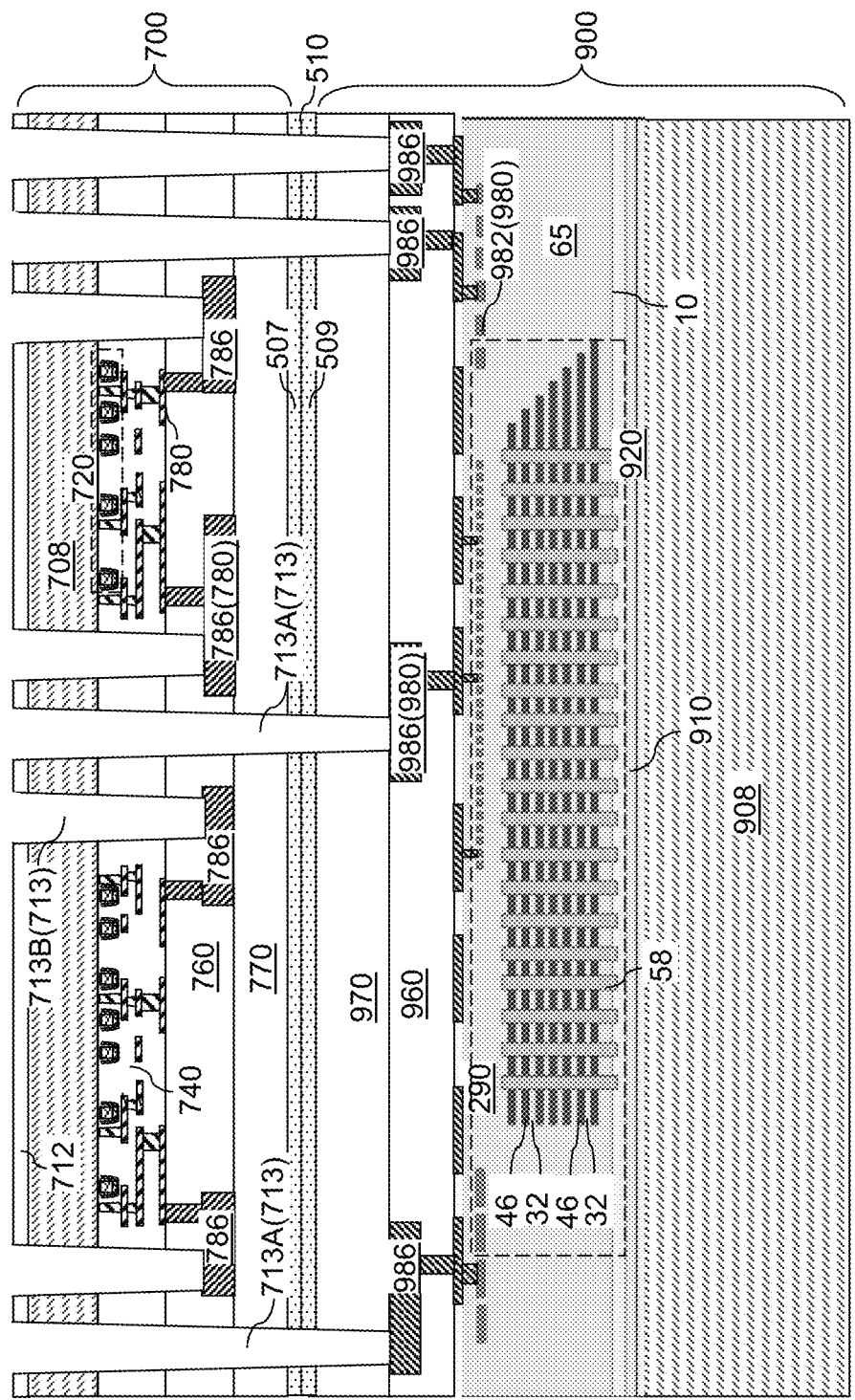
FIG. 5 is a schematic vertical cross-sectional view of the exemplary structure after formation of via cavities according to the first embodiment of the present disclosure.

Referring to FIG. 5, a photoresist layer (not shown) can be applied over the backside insulating layer 712, and can be lithographically patterned to form openings in areas that overlie the second metallic pad structures 786 or the first metallic pad structures 986. Each of the openings in the photoresist layer may be located entirely within the area of an underlying one of the second metallic pad structures 786 or the first metallic pad structures 986. Each of the openings in the photoresist layer may have a respective maximum lateral dimension (such as a diameter) in a range from 100 nm to 1,000 nm, although lesser and greater maximum lateral dimensions may also be employed.

An anisotropic etch process can be performed to transfer the pattern of the openings in the photoresist layer through the backside insulating layer 712, the second substrate 708, and portions of the second dielectric material layers (740, 760, 770), the optional second bonding dielectric material layer 507, the optional first bonding dielectric material layer 509, and the first dielectric material layers (290, 960, 970) that overlie a respective one of the second metallic pad structures 786 or the first metallic pad structures 986. In one embodiment, the anisotropic etch process may comprise a first etch step that etches the material of the backside insulating layer 712, a second etch step that etches the material of the second substrate 708, and a third etch step that etches the materials of the second dielectric material layers (740, 760, 770), the optional second bonding dielectric material layer 507, the optional first bonding dielectric material layer 509, and the first dielectric material layers (290, 960, 970) selective to the metallic materials of the second metallic pad structures 786 or the first metallic pad structures 986.

Via cavities 713 can be formed in the bonded assembly of the first semiconductor die 900 and the second semiconductor die 700. Generally, the via cavities 713 can be formed through the backside insulating layer (if present) 712, the second substrate 708, and a respective subset of layers of the layer stack including the second dielectric material layers (740, 760, 770), the optional second bonding dielectric material layer 507, the optional first bonding dielectric material layer 509, and the first dielectric material layers (290, 960, 970). In one embodiment, the via cavities 713 may comprise first via cavities 713A that extend through the backside insulating layer 712, the second substrate 708, the second dielectric material layers (740, 760, 770), and a respective subset of the first dielectric material layers (290, 960, 970) (such as the first blanket dielectric material layer 970) and to a respective one of the first metal interconnect structures 980 (such as the first metallic pad structures 986). Further, the via cavities 713 may comprise second via cavities 713B that extend through the backside insulating layer 712, the second substrate 708, and a respective subset of the second dielectric material layers (740, 760, 770) (such as the proximal interconnect-level dielectric layers 740 and the distal interconnect-level dielectric layers 760) and to a respective one of the second metal interconnect structures 780 (such as the second metallic pad structures 786). In one embodiment, the second via cavities 713B do not extend into the first semiconductor die 900 or into the second blanket dielectric material layer 770 located within the second semiconductor die 700. In one embodiment, each of the via cavities 713 may comprise a respective sidewall that vertically extends from a horizontal plane including a physically exposed horizontal surface of the backside insulating layer 712 to a top surface of a respective one of the first metallic pad structures 986 and the second metallic pad structures 786. The photoresist layer can be subsequently removed, for example, by ashing.

Figure 6:
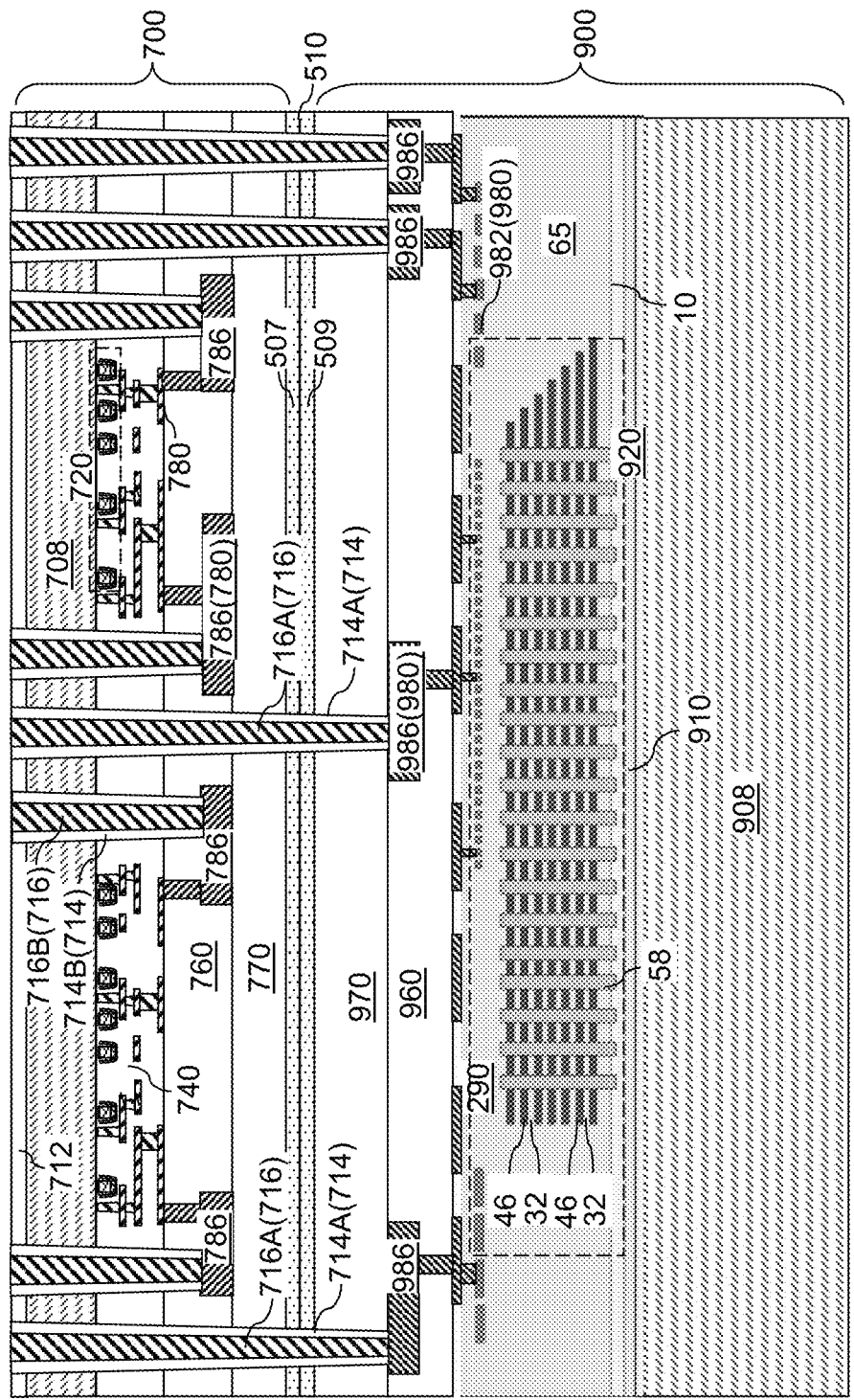
FIG. 6 is a schematic vertical cross-sectional view of the exemplary structure after formation of tubular insulating spacers and conductive via structures according to the first embodiment of the present disclosure.

Referring to FIG. 6, an insulating liner can be deposited in the via cavities 713 and over the backside insulating layer 712 by a conformal deposition process such as a chemical vapor deposition (CVD) process. The insulating liner includes a dielectric material such as silicon oxide, silicon nitride, and/or a dielectric metal oxide (such as aluminum oxide). The thickness of the insulating liner may be in a range from 10 nm to 300 nm, such as from 30 nm to 100 nm, although lesser and greater thicknesses may also be employed.

An anisotropic etch process can be performed to remove horizontally-extending portions of the insulating liner from above the backside insulating layer 712 and from the bottom regions of the via cavities 713. Each remaining cylindrical portion of the insulating liner constitutes tubular insulating spacers 714. The tubular insulating spacers 714 comprise first tubular insulating spacers 714A formed within the first via cavities 713A and second tubular insulating spacers 714B formed within the second via cavities 713B. In one embodiment, each of the first tubular insulating spacers 714A comprises a respective outer sidewall contacting a respective periphery of the dielectric-to-dielectric bonding interface 510. The second tubular insulating spacers 714B do not contact the bonding interface 510 and do not extend into the first semiconductor die 900.

At least one conductive material such as at least one metallic material can be deposited in remaining unfilled volumes of the via cavities 713. The at least one conductive material can include, for example, a metallic nitride liner material such as TiN, TaN, MoN and/or WN, and a metallic fill material such as W, Co, Cu, Ru, and/or Mo. The at least one conductive material can be deposited by physical vapor deposition or chemical vapor deposition.

Excess portions of the at least one conductive material can be removed from above the horizontal plane including the top surface of the backside insulating layer 712 by a planarization process such as a chemical mechanical planarization (CMP) process. Each portion of the at least one conductive material that fills a via cavity 713 constitutes a conductive via structure 716. The conductive via structures 716 comprise first conductive via structures 716A that are formed within a respective one of the first via cavities 713A and second conductive via structures 716B that are formed within a respective one of the second via cavities 713B.

The first conductive via structures 716A and second conductive via structures 716B are formed in the first via cavities 713A and the second via cavities 713B, respectively. The first conductive via structures 716A vertically extend through the backside insulating layer 712, the second substrate 708, the second dielectric material layers (740, 760, 770), and a respective subset of the first dielectric material layers (290, 960, 970) (such as the first blanket dielectric material layer 970) and to a respective one of the first metal interconnect structures 980 (such as the first metallic pad structures 986). The second conductive via structures 716B vertically extend through the backside insulating layer 712, the second substrate 708, and a respective subset of the second dielectric material layers (740, 760, 770) (such as the proximal interconnect-level dielectric layers 740 and the distal interconnect-level dielectric layers 760) and to a respective one of the second metal interconnect structures 780 (such as the second metallic pad structures 786). Each of the first conductive via structures 716A extend into the first semiconductor die 900 while the second conductive via structures 716B do not extend into the first semiconductor die 900.

In one embodiment, each of the first conductive via structures 716A and the second conductive via structures 716B has a respective end surface (such as a top surface) located within a same plane as a distal horizontal surface of the backside insulating layer 712, i.e., a horizontal surface of the backside insulating layer 712 that is vertically spaced from an interface with the second substrate 708 by a thickness of the backside insulating layer 712.

Generally, the first conductive via structures 716A and the second conductive via structures 716B have a same metallic material composition. In one embodiment, each of the first conductive via structures 716A is laterally surrounded by a respective first tubular insulating spacer 714A, and each of the second conductive via structures 716B is laterally surrounded by a respective second tubular insulating spacer 714B. In one embodiment, each of the first contact via structures 716A and the second contact via structures 716B has a maximum lateral dimension (such as a diameter of a top surface) in a range from 100 nm to 1,000 nm, such as from 500 nm to 700 nm, although lesser and greater maximum lateral dimensions may also be employed.

In one embodiment, the first tubular insulating spacers 714A and the first conductive via structures 716A vertically extend through the dielectric-to-dielectric bonding interface 510 within an area enclosed by an outer periphery of the dielectric-to-dielectric bonding interface that laterally encloses an entirety of a contact area between the first semiconductor die 900 and the second semiconductor die 700. The second tubular insulating spacers 714B and the second conductive via structures 716B do not vertically extend through the dielectric-to-dielectric bonding interface 510.

Figure 7:
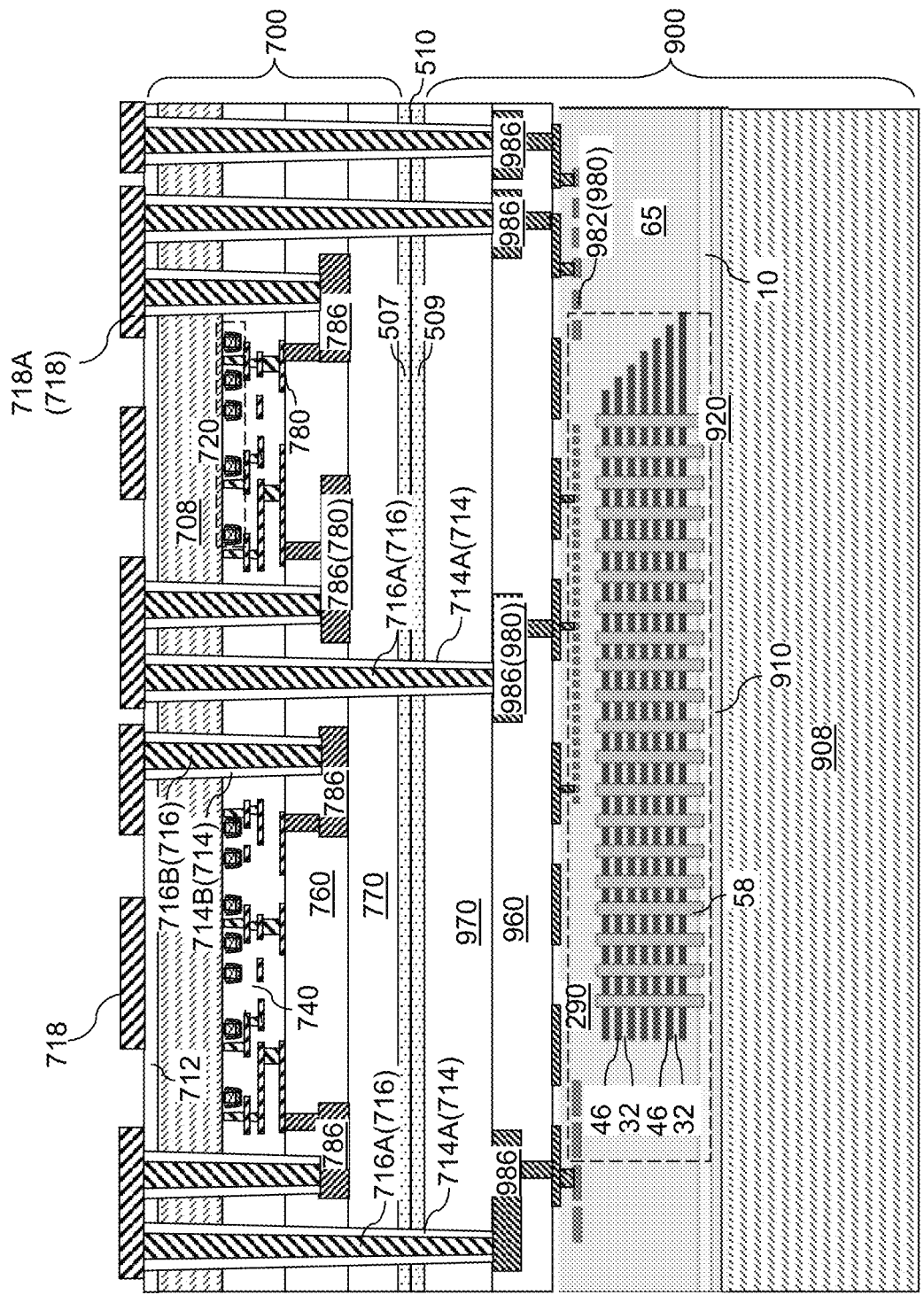
FIG. 7 is a schematic vertical cross-sectional view of the exemplary structure after formation of first redistribution metal interconnect lines according to the first embodiment of the present disclosure.

Referring to FIG. 7, a metal layer can be deposited on the top surface of the backside insulating layer (if present) 712 and on the end surfaces of the insulating spacers 714 and the conductive via structures 716, and can be patterned to form various redistribution metal interconnect structures 718 that are formed above the top surface of the backside insulating layer 712. The various redistribution metal interconnect structures 718 include first metal lines 718A which are referred to as first redistribution metal interconnect lines. The first metal lines 718A are a subset of metal redistribution metal interconnect structures 718 that are formed above the top surface of the backside insulating layer 712.

The first metal lines 718A can contact a respective subset of the first conductive via structures 716A and the second conductive via structures 716B, and can contact a respective segment of a distal horizontal surface of the backside insulating layer 712, i.e., a respective segment of a horizontal surface of the backside insulating layer 712 that does not contact the second substrate 708.

Figure 8:
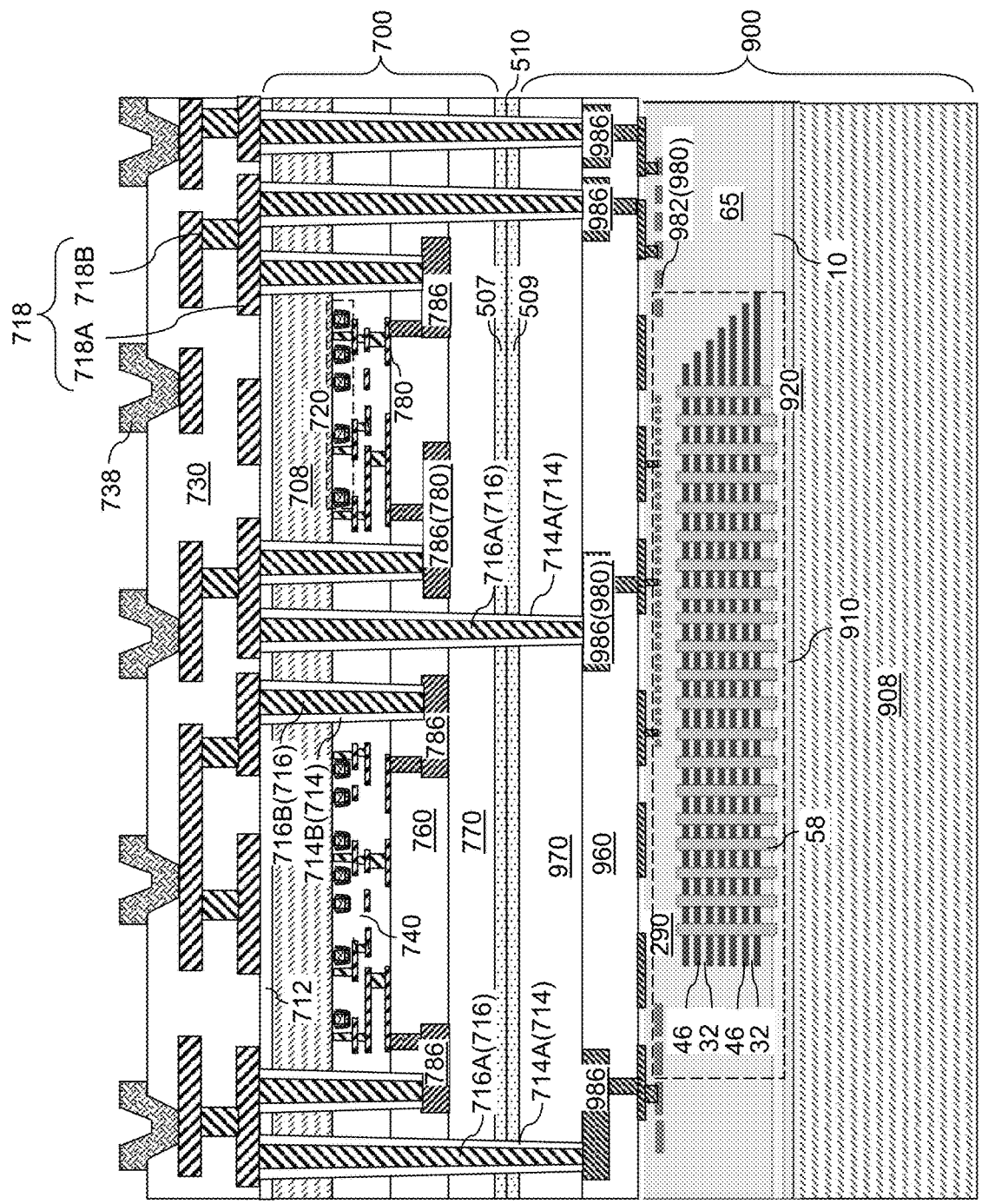
FIG. 8 is a schematic vertical cross-sectional view of the exemplary structure after formation of additional redistribution metal interconnect structures and external bonding pads according to the first embodiment of the present disclosure.

Referring to FIG. 8, additional metal via structures and metal lines 718B can be formed on top of the first metal lines 718A. Generally, the redistribution metal interconnect structures comprise at least one level of metal via structures and at least one level of metal line structures. In one embodiment, the redistribution metal interconnect structures 718 comprise at least one level of metal via structures and at least two levels of metal line structures. In one embodiment, the redistribution metal interconnect structures 718 comprise at least two levels of metal via structures and at least two levels of metal line structures.

Generally, one or more backside dielectric material layers 730 can be formed over a backside surface of the second substrate 707 (for example, above the backside insulating layer 712) such that the redistribution metal interconnect structures 718 are embedded within backside dielectric material layers 730. Thus, the redistribution metal interconnect structures 718 can be formed on the first conductive via structures 716A and the second conductive via structures 716B over a backside surface of the second substrate 708. The redistribution metal interconnect structures 718 electrically connect the first conductive via structures 716A to the second conductive via structures 716B. Thus, the peripheral circuitry 720 in the logic die 700 provide control signals to the memory devices 920 in the memory die 900 through the second conductive via structures 716B, the redistribution metal interconnect structures 718 and the first conductive via structures 716A.

External bonding pads 738 can be formed in a most distal backside dielectric material layer of the backside dielectric material layers 730 such that a surface of each of the external bonding pads 738 are physically exposed. The external bonding pads 738 are electrically connected to the redistribution metal interconnect structures 718. The external bonding pads 738 can be formed directly on a subset of the redistribution metal interconnect structures 718. The external bonding pads 738 may comprise wire bonding metal pads or may comprise C4 (controlled collapse chip connection) bonding pads.

Figure 9:
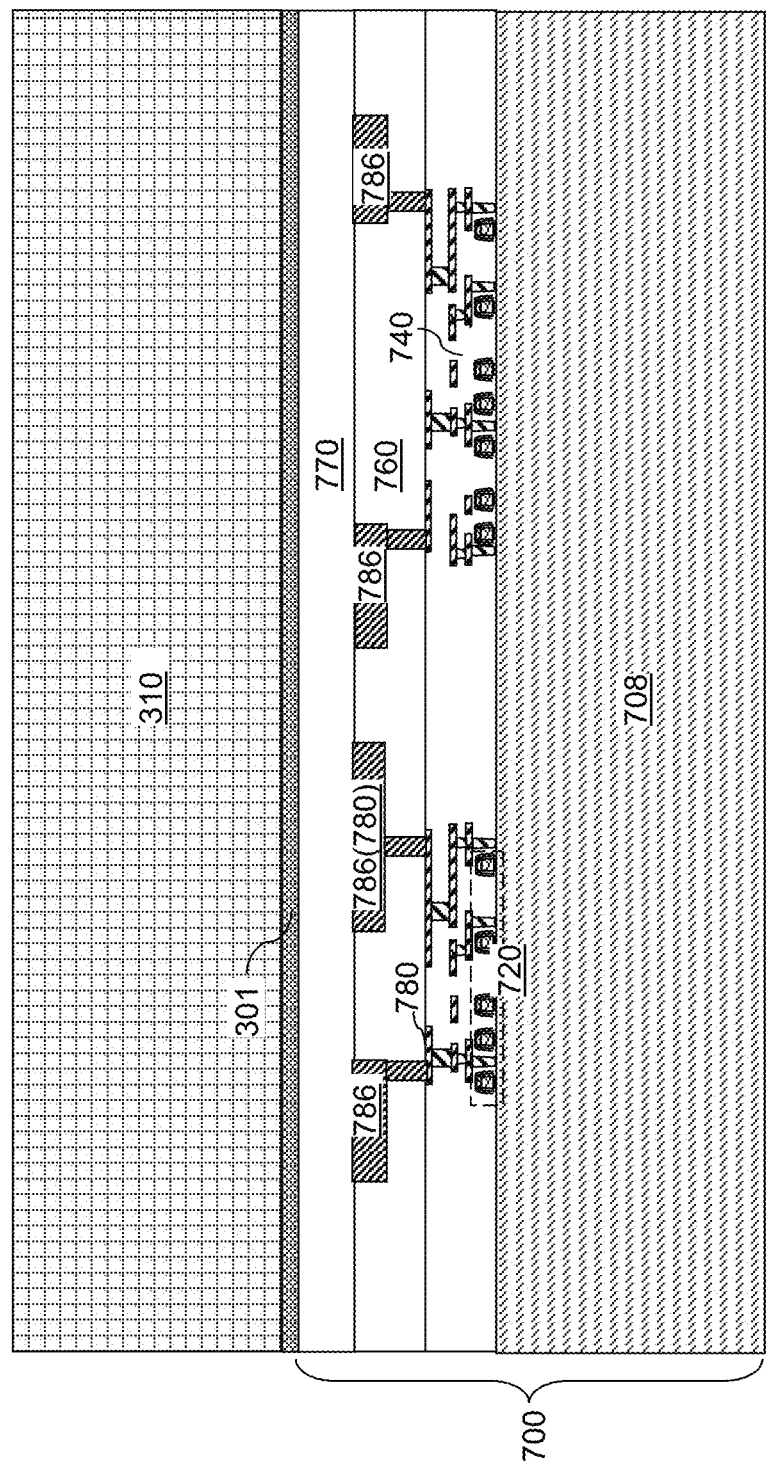
FIG. 9 is a schematic vertical cross-sectional view of the second semiconductor die after attaching a first carrier substrate to the front side of the second semiconductor die according to a second embodiment of the present disclosure.

Referring to FIG. 9, an alternative embodiment of the exemplary structure of the present disclosure is illustrated. The alternative embodiment of the exemplary structure can be provided by attaching a first carrier substrate 310 to the front side of a semiconductor die to be subsequently thinned. For example, the first carrier substrate 310 may be attached to the front side of the second semiconductor die 700, i.e., to the side including the second blanket dielectric material layer 770 of the second semiconductor die 700. While FIG. 9 illustrates an embodiment in which the first carrier substrate 310 is attached to the second semiconductor die 700, embodiments are expressly contemplated herein in which the first carrier substrate is attached to the first semiconductor die 900 followed by thinning the first substrate 908.

The first carrier substrate 310 may comprise a semiconductor substrate, a conductive substrate, or a dielectric (i.e., insulating) substrate. The thickness of the first carrier substrate 310 may be in a range from 100 microns to 2 mm, although lesser and greater thicknesses may also be employed. In one embodiment, a first decomposable adhesive layer 301 may be employed to attach the first carrier substrate 310 to the second semiconductor die 700. The first decomposable adhesive layer 301 may comprise a thermally decomposable adhesive material that decomposes at a temperature in a range from 150 degrees to 350 degrees. In case the first carrier substrate 310 comprises an optically transparent material, the first decomposable adhesive layer 301 may comprise an optically decomposable adhesive material that decomposes, for example, upon irradiation of ultraviolet light through the first carrier substrate.

Figure 10:
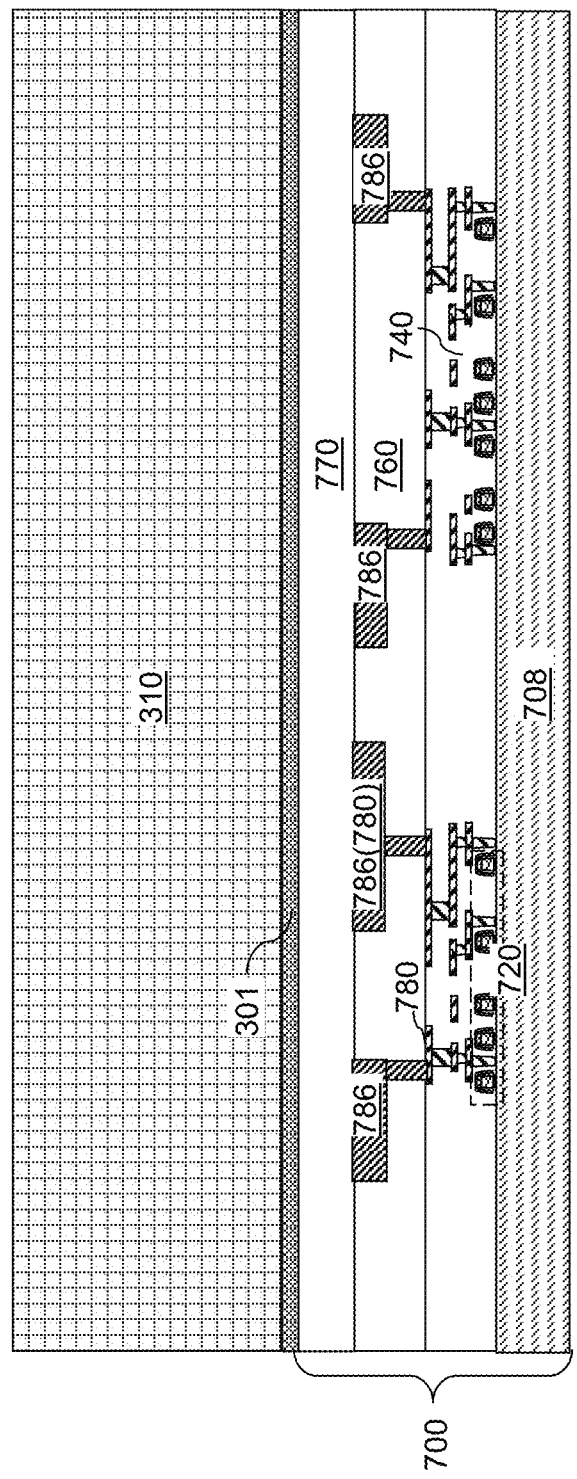
FIG. 10 is a schematic vertical cross-sectional view of the second semiconductor die after thinning the backside of the second semiconductor die according to the second embodiment of the present disclosure.

Referring to FIG. 10, the second substrate 708 can be thinned, for example, by grinding, polishing, an isotropic etch process, or an anisotropic etch process such that the thickness of the second substrate 708 after thinning can be in a range from 300 nm to 3,000 nm, such as 500 nm to 1,500 nm, although lesser and greater thicknesses can also be employed. In one embodiment, the second substrate 708 can be thinned from the backside while the first carrier substrate 310 is attached to the second dielectric material layers (740, 760, 770).

Figure 11:
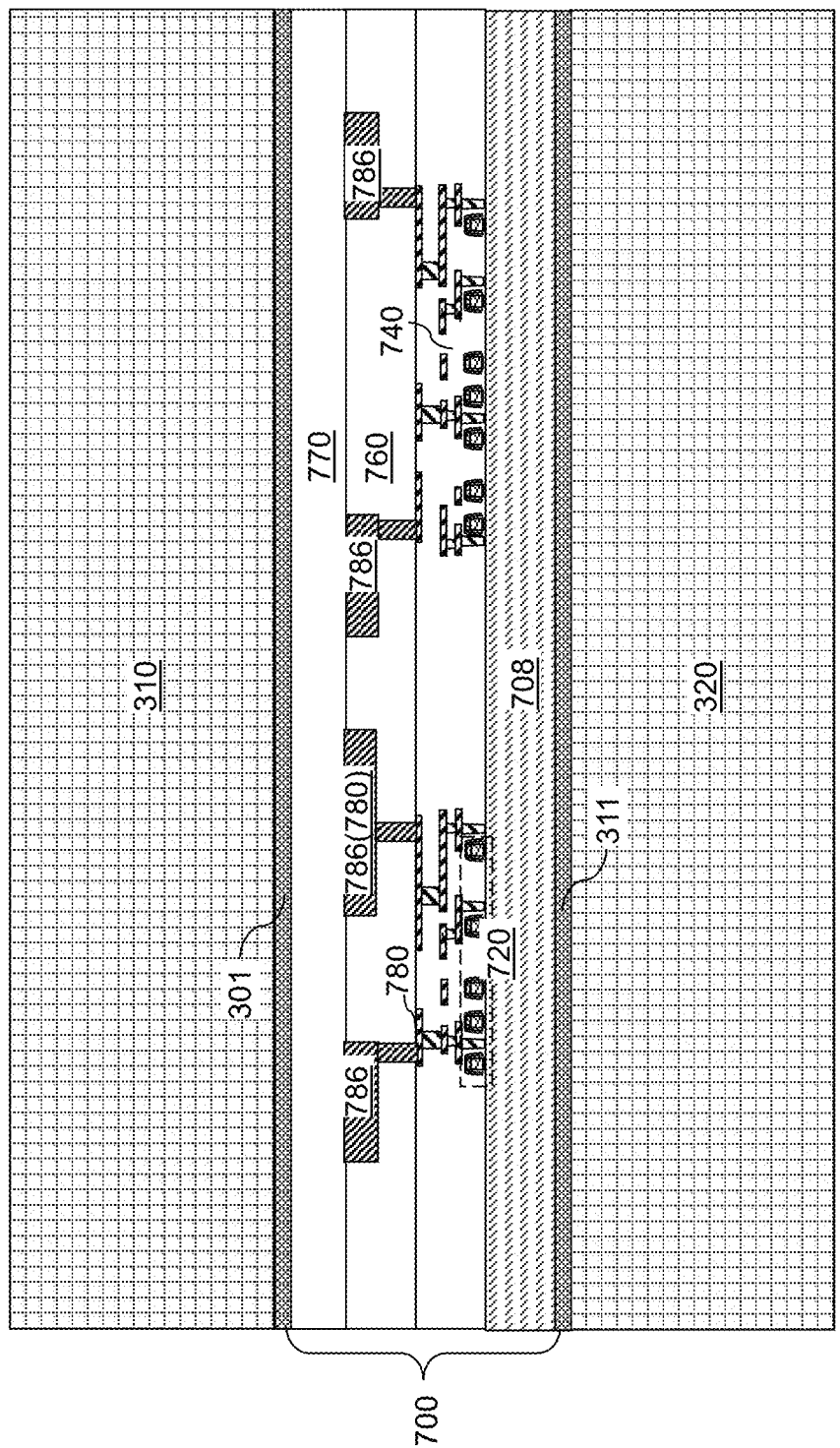
FIG. 11 is a schematic vertical cross-sectional view of the second semiconductor die after attaching a second carrier substrate to the backside of the second semiconductor die according to the second embodiment of the present disclosure.

Referring to FIG. 11, a second carrier substrate 320 can be attached to the backside of the thinned semiconductor die, which is the second semiconductor die 700 in the illustrated example. For example, the second carrier substrate 320 may be attached to the backside of the second semiconductor die 700, i.e., to the polished surface of the second substrate 708 of the second semiconductor die 700.

The second carrier substrate 320 may comprise a semiconductor substrate, a conductive substrate, or a dielectric substrate. The thickness of the second carrier substrate 320 may be in a range from 100 microns to 2 mm, although lesser and greater thicknesses may also be employed. In one embodiment, a second decomposable adhesive layer 311 may be employed to attach the second carrier substrate 320 to the second semiconductor die 700. The second decomposable adhesive layer 311 may comprise an optically decomposable adhesive material in case the second carrier substrate 320 comprises an optically transparent material. Alternatively, the second decomposable adhesive layer 311 may comprise a thermally decomposable adhesive material. In case the first decomposable adhesive layer 301 and the second decomposable adhesive layer 311 comprise thermally decomposable adhesive materials, the thermally decomposable adhesive material of the second decomposable adhesive layer 311 may have a higher decomposition temperature than the thermally decomposable adhesive material of the first decomposable adhesive layer 301 to enable detachment of the first carrier substrate 310 while keeping the second carrier substrate 320 attached to the second semiconductor die 700 in a subsequent processing step.

Figure 12:
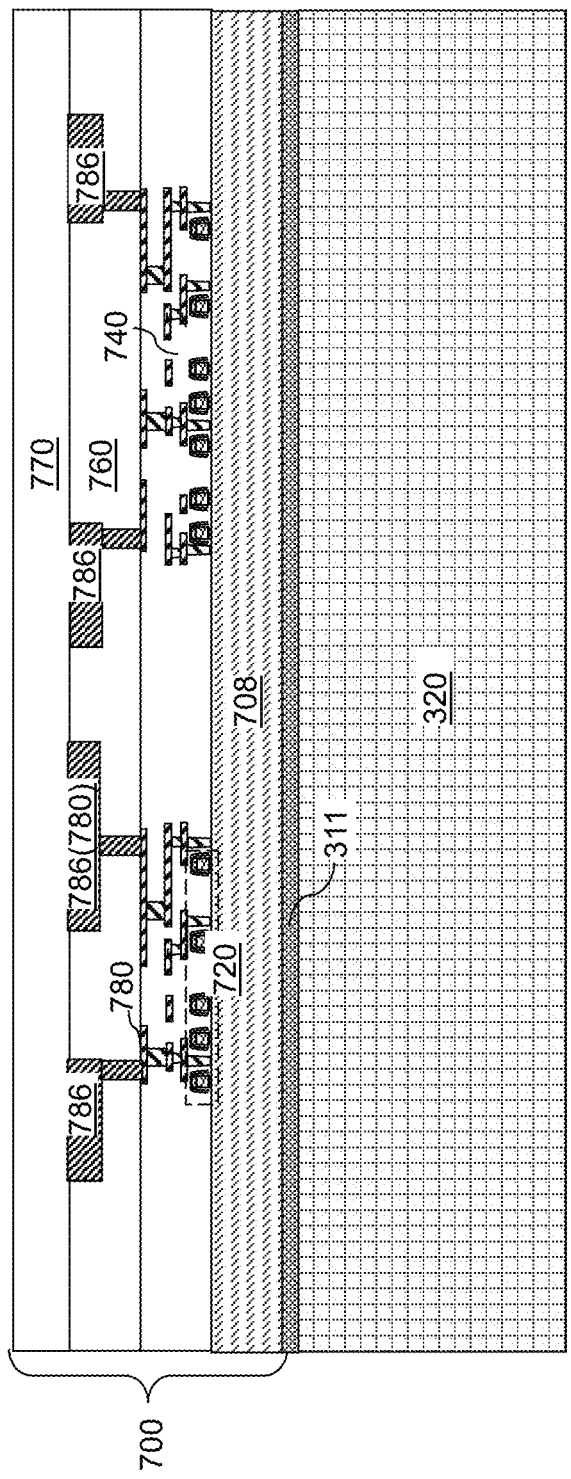
FIG. 12 is a schematic vertical cross-sectional view of the second semiconductor die after detaching the first carrier substrate from the second semiconductor die according to the second embodiment of the present disclosure.

Referring to FIG. 12, the first carrier substrate 310 can be detached from the second semiconductor die 700 by decomposing the first decomposable adhesive layer 301. A suitable cleaning process may be performed to remove residual portions of the first decomposable adhesive layer 301 from the physically exposed surface of the second substrate 708, which may be a horizontal surface of the second blanket dielectric material layer 770.

Figure 13:
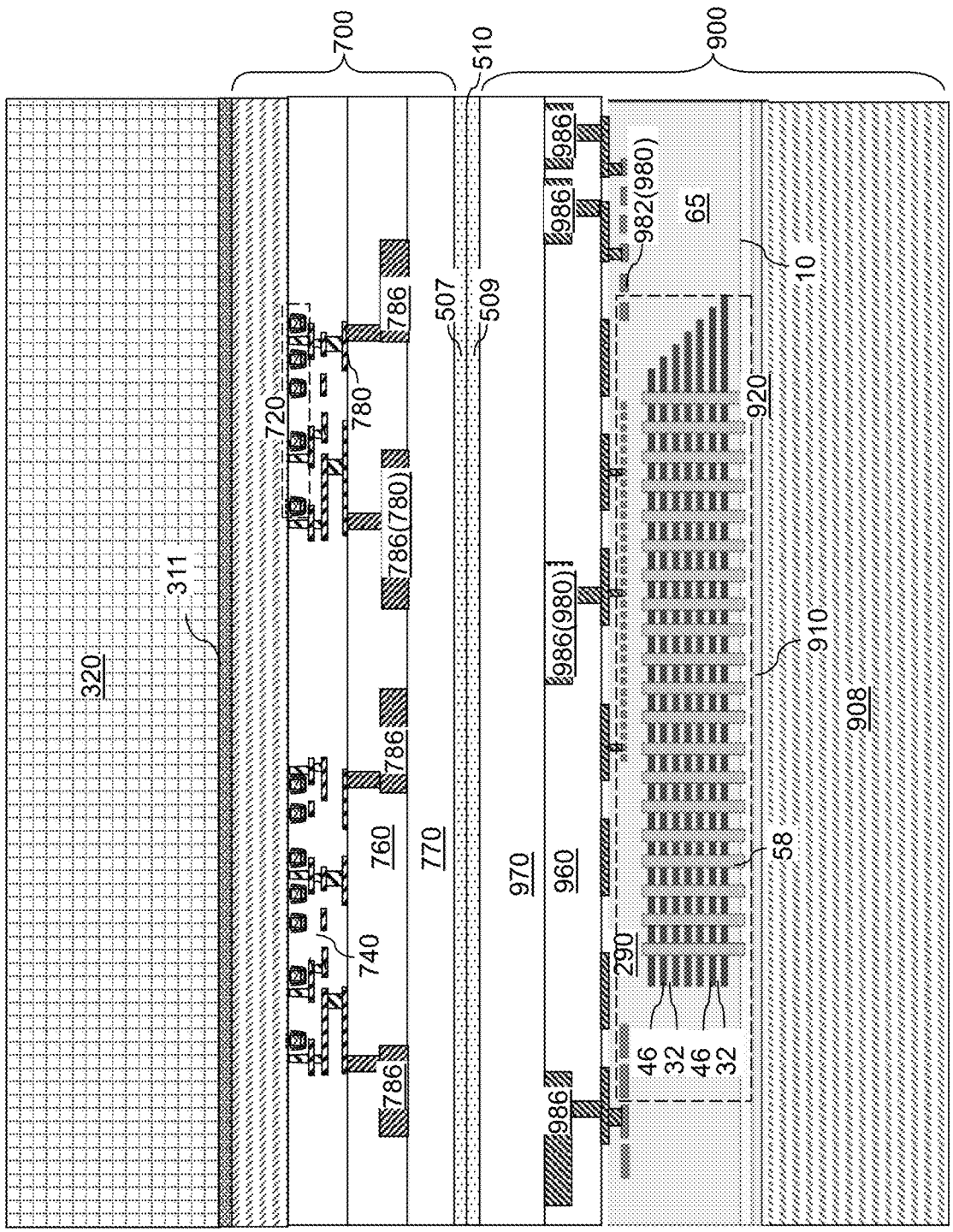
FIG. 13 is a schematic vertical cross-sectional view of an alternative configuration of the exemplary structure after attaching the second semiconductor die to the first semiconductor die according to the second embodiment of the present disclosure.

Referring to FIG. 13, a second bonding dielectric material layer 507 may be optionally formed on the physically exposed top surface of the second blanket dielectric material layer 770. The processing steps of FIG. 3 may be performed with any needed changes to bond the second semiconductor die 700 to the first semiconductor die 900. Specifically, changes to the processing steps of FIG. 3 may be made to accommodate the difference between the thick second substrate 708 employed at the processing steps of FIG. 3 and the combination of a thinned second substrate 708, the second decomposable adhesive layer 311, and the second carrier substrate 320.

The second carrier substrate 320 may be detached from the backside of the second substrate 708 during the bonding process that incudes dielectric-to-dielectric bonding between the first semiconductor die 900 and the second semiconductor die 700, or after the bonding process. For example, if the second decomposable adhesive layer 311 comprises a thermally decomposable adhesive material, the second carrier substrate 320 may be detached from the second substrate 708 during the bonding process. If the second decomposable adhesive layer 311 comprises an optically decomposable adhesive material and if the second carrier substrate 320 comprises an optically transparent material (such as glass or sapphire), the second decomposable adhesive layer 311 may be decomposed after the bonding process by optical irradiation of the second decomposable adhesive layer 311 through the second carrier substrate 320.

Subsequently, the processing step of FIG. 4 may be performed to provide the exemplary structure illustrated in FIG. 13. The second carrier substrate 320 is then detached from the second substrate 708, and the steps of FIGS. 5 to 8 are performed to form the bonded assembly shown in FIG. 8.

Referring to all drawings and according to various embodiments of the present disclosure, a bonded assembly is provided, which comprises: a first semiconductor die 900 comprising a first substrate 908, first semiconductor devices 920 located on the first substrate 908, first dielectric material layers (290, 960, 970) located on the first semiconductor devices 920, and first metal interconnect structures 980 embedded in the first dielectric material layers (290, 960, 970); a second semiconductor die 700 overlying the first semiconductor die 900, and comprising a second substrate 708, second semiconductor devices 720 located on the second substrate 708, second dielectric material layers (740, 760, 770) located on the second semiconductor devices 720, and second metal interconnect structures 780 embedded in the second dielectric material layers (740, 760, 770); first conductive via structures 716A vertically extending through the second substrate 708, the second dielectric material layers (740, 760, 770), and a respective subset of the first dielectric material layers (290, 960, 970), and contacting a respective one of the first metal interconnect structures 980; second conductive via structures 716B vertically extending through the second substrate 708 and a respective subset of the second dielectric material layers (740, 760, 770), and contacting a respective one of the second metal interconnect structures 780; and redistribution metal interconnect structures 718 located over a backside surface of the second substrate 708 and electrically connecting the first conductive via structures 716A and the second conductive via structures 716B.

In one embodiment, the redistribution metal interconnect structures 718 comprise at least one level of metal via structures and at least one level of metal line structures.

In one embodiment, the redistribution metal interconnect structures 718 are embedded within backside dielectric material layers 730.

In one embodiment, the bonded assembly comprises external bonding pads 738 located in a most distal backside dielectric material layer OF the backside dielectric material layers 730 and electrically connected to the redistribution metal interconnect structures 718.

In one embodiment, the bonded assembly comprises a backside insulating layer 712 located on a backside surface of the second substrate 708, wherein each of the first conductive via structures 716A and the second conductive via structures 716B has a respective end surface located within a same plane as a distal horizontal surface of the backside insulating layer 712.

In one embodiment, the redistribution metal interconnect structures 718 comprise first metal lines 718A contacting a respective subset of the first conductive via structures 716A and the second conductive via structures 716B and contacting a respective segment of the distal horizontal surface of the backside insulating layer 712.

In one embodiment, the first conductive via structures 716A and the second conductive via structures 716B have a same metallic material composition.

In one embodiment, each of the first conductive via structures 716A is laterally surrounded by a respective first tubular insulating spacer 714A; and each of the second conductive via structures 716B is laterally surrounded by a respective second tubular insulating spacer 714B.

In one embodiment, the first semiconductor die 900 and the second semiconductor die 700 are bonded to each other by dielectric-to-dielectric bonding at a dielectric-to-dielectric bonding interface 510; and a horizontal surface of the first dielectric material layers (290, 960, 970) is bonded to a horizontal surface of the second dielectric material layers (740, 760, 770) at the dielectric-to-dielectric bonding interface 510. Alternatively, at least one bonding dielectric material layer (509. 507) may be located between the first dielectric material layers (290, 960, 970) and the second dielectric material layers (740, 760, 770).

In one embodiment, each of the first tubular insulating spacers 714A comprises a respective outer sidewall contacting a respective periphery of the dielectric-to-dielectric bonding interface.

In one embodiment, the first tubular insulating spacers 714A and the first conductive via structures 716A are the only structures that vertically extend through the dielectric-to-dielectric bonding interface 510 within an area enclosed by an outer periphery of the dielectric-to-dielectric bonding interface 510 that laterally encloses an entirety of a contact area between the first semiconductor die 900 and the second semiconductor die 700. In one embodiment, there are no metal bonding pads in a horizontal plane of the dielectric-to-dielectric bonding interface 510.

In one embodiment, the second substrate 708 comprises a semiconductor material and has a thickness in a range from 300 nm to 3,000 nm; each of the first contact via structures and the second contact via structures has a maximum lateral dimension in a range from 100 nm to 1,000 nm; and the second dielectric material layers (740, 760, 770) have a thickness in a range from 1,000 nm to 6,000 nm.

In one embodiment, one of the first semiconductor die 900 and the second semiconductor die 700 comprises a memory die; and another of the first semiconductor die 900 and the second semiconductor die 700 comprises a logic die.

In one embodiment, the memory die comprises a three-dimensional memory array that includes an alternating stack of insulating layers 32 and electrically conductive layers 46, memory openings vertically extending through the alternating stack (32, 46), memory opening fill structures 58 located in the memory openings and comprising a respective vertical stack of memory elements and a respective vertical semiconductor channel; and the logic die comprises a control circuit configured control operation of the three-dimensional memory array, the control circuit comprising word line drivers that apply word line control voltages to the electrically conductive layers 46 and bit line drivers that apply bit line control voltages to bit lines 928 which are electrically connected to end portions of a respective subset of the vertical semiconductor channels.

According to an aspect of the present disclosure, the various embodiments of the present disclosure can be employed to form a bonded assembly of two semiconductor dies employing dielectric-to-dielectric bonding and without employing metal-to-metal bonding. Generally, metal-to-metal bonding requires a higher bonding temperature than dielectric-to-dielectric bonding, and thus, degrades device performance and reduces devices reliability. The methods of the present disclosure can be employed to increase the bonding yield and to improve the reliability of bonded assembly of at least two semiconductor dies.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:
a first semiconductor die comprising a first substrate, first semiconductor devices located on the first substrate, first dielectric material layers located on the first semiconductor devices, and first metal interconnect structures embedded in the first dielectric material layers;
a second semiconductor die overlying the first semiconductor die, and comprising a second substrate, second semiconductor devices located on the second substrate, second dielectric material layers located on the second semiconductor devices, and second metal interconnect structures embedded in the second dielectric material layers;
first conductive via structures vertically extending through the second substrate, the second dielectric material layers, and a respective subset of the first dielectric material layers, and contacting a respective one of the first metal interconnect structures;
second conductive via structures vertically extending through the second substrate and a respective subset of the second dielectric material layers, and contacting a respective one of the second metal interconnect structures; and
redistribution metal interconnect structures located over a backside surface of the second substrate and electrically connecting the first conductive via structures to the second conductive via structures;

wherein:
the first semiconductor die further comprises a first bonding dielectric material layer;
the second semiconductor die further comprises a second bonding dielectric material layer;
the second semiconductor die is bonded to the first semiconductor die via dielectric-to-dielectric bonding at a horizontal bonding interface at which the second bonding dielectric material layer is in direct contact with the first bonding dielectric layer, the horizontal bonding interface including discrete openings therethrough;
first conductive via structures each have a respective vertically-extending sidewall that vertically extends through the second substrate, the second dielectric material layers, the second bonding dielectric material layer, a respective one of the discrete openings through the horizontal bonding interface, the first bonding dielectric material layer, and the respective subset of the first dielectric material layers;
each of the first bonding dielectric material layer and the second bonding dielectric material layer does not laterally surround any conductive structure other than the first conductive via structures; and
there are no metal bonding pads in a horizontal plane of the horizontal bonding interface.

2. The bonded assembly of claim 1, wherein the redistribution metal interconnect structures comprise at least one level of metal via structures and at least one level of metal line structures.

3. The bonded assembly of claim 1, wherein the redistribution metal interconnect structures are embedded within backside dielectric material layers.

4. The bonded assembly of claim 3, further comprising external bonding pads located in a most distal backside dielectric material layer of the backside dielectric material layers and electrically connected to the redistribution metal interconnect structures.

5. The bonded assembly of claim 1, further comprising a backside insulating layer located on a backside surface of the second substrate, wherein each of the first conductive via structures and the second conductive via structures has a respective end surface located within a same plane as a distal horizontal surface of the backside insulating layer.

6. The bonded assembly of claim 5, wherein the redistribution metal interconnect structures comprise first metal lines contacting a respective subset of the first conductive via structures and the second conductive via structures, and contacting a respective segment of the distal horizontal surface of the backside insulating layer.

7. The bonded assembly of claim 1, wherein the first conductive via structures and the second conductive via structures have a same metallic material composition.

8. The bonded assembly of claim 1, wherein:
each of the first conductive via structures is laterally surrounded by a respective first tubular insulating spacer; and
each of the second conductive via structures is laterally surrounded by a respective second tubular insulating spacer.

9. The bonded assembly of claim 8, wherein the first semiconductor die and the second semiconductor die are bonded to each other by dielectric-to-dielectric bonding at the horizontal bonding interface comprising a dielectric-to-dielectric bonding interface.

10. The bonded assembly of claim 9, wherein each of the first tubular insulating spacers comprises a respective outer sidewall contacting a respective periphery of the dielectric-to-dielectric bonding interface.

11. The bonded assembly of claim 9, wherein the first tubular insulating spacers and the first conductive via structures are the only structures that vertically extend through the dielectric-to-dielectric bonding interface within an area enclosed by an outer periphery of the dielectric-to-dielectric bonding interface that laterally encloses an entirety of a contact area between the first semiconductor die and the second semiconductor die.

12. The bonded assembly of claim 1, wherein:
the second substrate comprises a semiconductor material and has a thickness in a range from 300 nm to 3,000 nm; and
each of the first contact via structures and the second contact via structures has a maximum lateral dimension in a range from 100 nm to 1,000 nm.

13. The bonded assembly of claim 1, wherein:
one of the first semiconductor die and the second semiconductor die comprises a memory die; and
another of the first semiconductor die and the second semiconductor die comprises a logic die.

14. The bonded assembly of claim 13, wherein:
the memory die comprises a three-dimensional memory array that includes an alternating stack of insulating layers and electrically conductive layers, memory openings vertically extending through the alternating stack, memory opening fill structures located in the memory openings and comprising a respective vertical stack of memory elements and a respective vertical semiconductor channel; and
the logic die comprises a control circuit configured control operation of the three-dimensional memory array, the control circuit comprising word line drivers that apply word line control voltages to the electrically conductive layers and bit line drivers that apply bit line control voltages to bit lines which are electrically connected to end portions of a respective subset of the vertical semiconductor channels.

15. The bonded assembly of claim 1, wherein:
a horizontal surface of the first bonding dielectric material layer that is not in direct contact with the second bonding dielectric material layer is more proximal to the second semiconductor die than any of the first metal interconnect structures is to the second semiconductor die; and
a horizontal surface of the second bonding dielectric layer that is not in direct contact with the first bonding dielectric layer is more proximal to the first semiconductor die than any of the second metal interconnect structures is to the first semiconductor die.

16. The bonded assembly of claim 1, wherein:
the first bonding dielectric material layer is not in direct contact with any of the first metal interconnect structures, and is not in direct contact with any conductive structure that is electrically connected to the first metal interconnect structure; and
the second bonding dielectric material layer is not in direct contact with any of the second metal interconnect structures, and is not in direct contact with any conductive structure that is electrically connected to the second metal interconnect structure.

17. The bonded assembly of claim 1, wherein:
an entirety of the horizontal bonding interface consists of a horizontal surface of the first bonding dielectric material layer and a horizontal surface of the second bonding dielectric material layer.

18. The bonded assembly of claim 1, wherein:
the first bonding dielectric material layer is not in direct contact with any conductive material; and
the second bonding dielectric material is not in direct contact with any conductive material.

19. The bonded assembly of claim 1, wherein each discrete opening in the horizontal bonding interface is in direct contact with an outer sidewall of a respective tubular insulating spacer that vertically extends straight from a horizontal plane including top end surfaces of the first conductive via structures to a horizontal plane including a bottom end surface of a respective one of the first conductive via structures.

* * * * *